(12) United States Patent  
Sakai

(10) Patent No.: US 8,896,085 B2  
(45) Date of Patent: Nov. 25, 2014

(54) SEMICONDUCTOR LIGHT-EMITTING ELEMENT MANUFACTURING METHOD, LAMP, ELECTRONIC EQUIPMENT, AND MECHANICAL APPARATUS

(75) Inventor: Hiromitsu Sakai, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 114 days.

(21) Appl. No.: 13/382,749

(22) PCT Filed: Jul. 9, 2010

(86) PCT No.: PCT/JP2010/061691  
§ 371 (c)(1),  
(2), (4) Date: Jan. 6, 2012

(87) PCT Pub. No.: WO2011/004890  
PCT Pub. Date: Jan. 13, 2011

(65) Prior Publication Data  
US 2012/0113658 A1 May 10, 2012

(30) Foreign Application Priority Data  
Jul. 10, 2009 (JP) .................................. 2009-164004  
Jul. 14, 2009 (JP) .................................. 2009-165993

(51) Int. Cl.  
*H01L 21/36* (2006.01)  
*H01L 33/00* (2010.01)  
*H01L 33/02* (2010.01)

(52) U.S. Cl.  
CPC .............. *H01L 33/007* (2013.01); *H01L 33/02* (2013.01)  
USPC ............... 257/478; 257/22; 257/41; 257/503; 257/507; 257/E21.351

(58) Field of Classification Search  
USPC .......... 438/22, 39, 41, 45, 46, 478, 500, 503, 438/507, E21.351  
See application file for complete search history.

(56) References Cited

U.S. PATENT DOCUMENTS

| 6,258,614 B1 * | 7/2001 | Kaneko ............................ 438/22 |
| 6,377,598 B1 * | 4/2002 | Watanabe et al. ........... 372/46.01 |
| 6,462,354 B1 * | 10/2002 | Okuyama ....................... 257/13 |
| 6,567,443 B2 * | 5/2003 | Bour et al. .................. 372/45.01 |
| 2007/0015306 A1 | 1/2007 | Takanami et al. |

(Continued)

FOREIGN PATENT DOCUMENTS

| CN | 100418247 C | 9/2008 |
| JP | 2009-123718 A | 2/1995 |

(Continued)

OTHER PUBLICATIONS

Taiwanese Office Action dated Aug. 29, 2013, issued in Taiwanese Patent Application No. 09912270.

(Continued)

*Primary Examiner* — Eduardo A Rodela  
(74) *Attorney, Agent, or Firm* — Sughrue Mion, PLLC

(57) ABSTRACT

A semiconductor light-emitting element manufacturing method including: a first step in which a first n-type semiconductor layer is laminated onto a substrate in a first organometallic chemical vapor deposition apparatus; and a second step in which a regrowth layer, a second n-type semiconductor layer, an active layer, and a p-type semiconductor layer are sequentially laminated onto the aforementioned first n-type semiconductor layer in a second organometallic chemical vapor deposition apparatus.

7 Claims, 4 Drawing Sheets

(56) References Cited

U.S. PATENT DOCUMENTS

| | | | |
|---|---|---|---|
| 2009/0194784 A1 | 8/2009 | Kaji et al. | |
| 2010/0006874 A1 | 1/2010 | Sakurai | |
| 2011/0003463 A1* | 1/2011 | Shenai-Khatkhate | ........ 438/478 |

FOREIGN PATENT DOCUMENTS

| | | |
|---|---|---|
| JP | 2007-027248 A | 2/2007 |
| JP | 2008-218740 A | 9/2008 |
| JP | 2008-294053 A | 12/2008 |
| JP | 2009-123718 A | 6/2009 |
| TW | 200838000 A | 9/2008 |

OTHER PUBLICATIONS

International Search Report of PCT/JP2010/061691 dated Aug. 17, 2010.
International Search Report of PCT/JP2010/061691 dated Jul. 9, 2010.
Office Action ("Notice of Reasons for Rejection") with a mailing date of Dec. 4, 2012 for corresponding Japanese Application No. 2009-164004.
Office Action ("Text of First Office Action (PCT)") with a mailing date of Jan. 3, 2014 for corresponding Chinese Patent Application No. 201080039686.5.

* cited by examiner

SEMICONDUCTOR LIGHT-EMITTING ELEMENT MANUFACTURING METHOD, LAMP, ELECTRONIC EQUIPMENT, AND MECHANICAL APPARATUS

TECHNICAL FIELD

The present invention relates to a method of manufacture of a semiconductor light-emitting element, and to lamps, electronic equipment, and mechanical apparatuses.

Priority is claimed on Japanese Patent Application No. 2009-164004, filed Jul. 10, 2009, and Japanese Patent Application No. 2009-165993, filed Jul. 14, 2009, the content of which is incorporated herein by reference.

BACKGROUND ART

Previously, as a semiconductor light-emitting element for use in light-emitting diodes, semiconductor lasers, and the like, there has been an element in which sequential lamination of an n-type semiconductor layer, an active layer (light-emitting layer), and a p-type semiconductor layer is performed on a substrate. As a method of manufacturing such a semiconductor light-emitting element, there is a method in which an n-type semiconductor layer, an active layer, and a p-type semiconductor layer are sequentially and continuously laminated in this order on top of a substrate composed of sapphire single crystal or the like by a metal organic chemical vapor deposition (MOCVD) method.

However, when an n-type semiconductor layer, an active layer, and a p-type semiconductor layer are sequentially and continuously laminated on a substrate, these layers are formed within the same deposition chamber. Therefore, the dopant used when forming the n-type semiconductor layer may hinder formation of the p-type semiconductor layer, and there is a case that obtainment of a p-type semiconductor layer of sufficiently low resistivity is prevented.

As a technology for solving such problems, Patent Document 1, for example, proposes a method of manufacture of a compound-semiconductor device wherein at least a semiconductor layer with a first type of conductivity and a semiconductor layer with a second type of conductivity are sequentially formed on a prescribed substrate when manufacturing the compound-semiconductor device, and the respective semiconductor layers with the aforementioned conductivity types are formed in mutually different and independent deposition chambers corresponding to the conductivity types.

Moreover, recently, it is increasingly the case that large volumes of current are applied to semiconductor light-emitting elements in order to enhance the light-emitting output of semiconductor light-emitting elements.

PRIOR ART DOCUMENTS

Patent Document 1: Japanese Unexamined Patent Application, First Publication No. H7-45538

DISCLOSURE OF INVENTION

Problem to be Solved by the Invention

However, when the deposition chamber in which the n-type semiconductor layer is formed and the deposition chamber in which the p-type semiconductor layer is formed are completely separated, it may happen that the light-emitting output of the obtained semiconductor light-emitting element is insufficient.

On the other hand, with conventional semiconductor light-emitting elements, although light-emitting output rises as applied current increases, the degree of the effect of light-emitting-output enhancement obtained by increasing applied current gradually declines as applied current increases. Accordingly, in cases where a large volume of current is applied to a semiconductor light-emitting element, the effect of light-emitting-output enhancement obtained by increasing applied current is insufficient. Consequently, with respect to semiconductor light-emitting elements, there has been a growing demand for an element which enables effective enhancement of light-emitting output by application of a large volume of current, and which can be optimally used when a large volume of current is applied, and for a method of manufacture thereof.

The present invention was made in light of the foregoing problems, and its object is to provide a semiconductor light-emitting element manufacturing method which inhibits occurrence of defects in a p-type semiconductor layer deriving from dopant used when forming an n-type semiconductor layer, and which enables manufacture of a semiconductor light-emitting element that obtains high output.

In addition, its object is to provide a semiconductor light-emitting element manufacturing method which enables manufacture of a semiconductor light-emitting element that obtains high light-emitting output by application of a large volume of current, as well as lamps, electronic equipment, and mechanical apparatuses provided with semiconductor light-emitting elements manufactured using this manufacturing method.

Means for Solving the Problems

As a result of diligent study aimed at solving the aforementioned problems, the present inventors perfected this invention as follows.

A first aspect of the present invention offers a semiconductor light-emitting element manufacturing method including a step (first step) in which a first n-type semiconductor layer is laminated onto a substrate in a first organometallic chemical vapor deposition apparatus, and a step (second step) in which a regrowth layer of the aforementioned first n-type semiconductor layer, a second n-type semiconductor layer, an active layer, and a p-type semiconductor layer are sequentially laminated onto the aforementioned first n-type semiconductor layer in a second organometallic chemical vapor deposition apparatus.

That is, the first aspect of the present invention is the following manufacturing method of a semiconductor light-emitting element.

(1) A semiconductor light-emitting element manufacturing method including: a first step in which a first n-type semiconductor layer is laminated onto a substrate in a first organometallic chemical vapor deposition apparatus;

and a second step in which a regrowth layer, a second n-type semiconductor layer, an active layer, and a p-type semiconductor layer are sequentially laminated onto the aforementioned first n-type semiconductor layer in a second organometallic chemical vapor deposition apparatus.

(2) The semiconductor light-emitting element manufacturing method according to the preceding item (1) wherein, in the aforementioned second step, the aforementioned second n-type semiconductor layer has a superlattice structure obtained by repetitive growth of 20-40 thin-film layers.

(3) The semiconductor light-emitting element manufacturing method according to the preceding items (1) or (2) wherein the growth conditions of the aforementioned first n-type semiconductor layer in the aforementioned first step and the growth conditions of the aforementioned regrowth layer in the aforementioned second step are identical.

(4) The semiconductor light-emitting element manufacturing method according to any of the items (1)-(3) wherein the first n-type semiconductor layer and the regrowth layer are n-contact layers, and the aforementioned second n-type semiconductor layer is an n-clad layer.

(5) The semiconductor light-emitting element manufacturing method according to any of the items (1)-(4) wherein a thickness of the aforementioned regrowth layer is 0.05 μm-2 μm.

(6) The semiconductor light-emitting element manufacturing method according to any of the items (1)-(5) wherein, prior to formation of the aforementioned regrowth layer, a sub-step is included in which heat treatment is conducted at a heat treatment temperature of 500° C.-1000° C. in a nitrogen-containing atmosphere.

(7) A lamp which is provided with a semiconductor light-emitting element manufactured using the semiconductor light-emitting element manufacturing method according to any of the items (1)-(6).

(8) Electronic equipment which incorporates the lamp according to item (7).

(9) A mechanical apparatus which incorporates the electronic equipment according to item (8).

(10) The semiconductor light-emitting element manufacturing method according to any of the items (1)-(6) wherein the regrowth layer is a growth layer of the first n-type semiconductor layer, and is an n-type semiconductor layer.

A second aspect of the present invention offers a semiconductor light-emitting element manufacturing method including: a first step in which a first n-type semiconductor layer is laminated onto a substrate in a first organometallic chemical vapor deposition apparatus;

and a second step in which a regrowth layer of the aforementioned first n-type semiconductor layer, a second n-type semiconductor layer, a light-emitting layer, and a p-type semiconductor layer are sequentially laminated onto the aforementioned first n-type semiconductor layer in a second organometallic chemical vapor deposition apparatus;

wherein the aforementioned light-emitting layer is grown at a pressure of 500 mbar-1013 mbar (under atmospheric pressure) in a deposition chamber of the aforementioned second organometallic chemical vapor deposition apparatus in the aforementioned second step.

That is, the second aspect of the present invention is the following semiconductor light-emitting element manufacturing method.

(1) A semiconductor light-emitting element manufacturing method including: a first step in which a first n-type semiconductor layer is laminated onto a substrate in a first organometallic chemical vapor deposition apparatus;

and a second step in which a regrowth layer, a second n-type semiconductor layer, a light-emitting layer, and a p-type semiconductor layer are sequentially laminated onto the aforementioned first n-type semiconductor layer in a second organometallic chemical vapor deposition apparatus;

wherein the aforementioned light-emitting layer is grown at a pressure of 500 mbar-1013 mbar (under atmospheric pressure) in a deposition chamber of the aforementioned second organometallic chemical vapor deposition apparatus in the aforementioned second step.

(2) The semiconductor light-emitting element manufacturing method according to item (1), which includes a step in which the aforementioned light-emitting layer is grown as a layer composed of a Group III nitride semiconductor layer by supplying a Group III raw material containing a Group III element to the aforementioned second organometallic chemical vapor deposition chamber together with a first carrier gas of a flow rate of 30 SLM-100 SLM, and by simultaneously supplying a nitrogen raw material that contains nitrogen or a nitrogen compound together with a second carrier gas to the aforementioned deposition chamber.

(3) A lamp which is provided with a semiconductor light-emitting element manufactured using the semiconductor light-emitting element manufacturing method according to item (1) or (2).

(4) Electronic equipment which incorporates the lamp according to item (3).

(5) A mechanical apparatus which incorporates the electronic equipment according to item (4).

Effects of the Invention

The semiconductor light-emitting element manufacturing method of the present invention includes a step (first step) in which a first n-type semiconductor layer is laminated onto a substrate in a first organometallic chemical vapor deposition apparatus, and a step (second step) in which a regrowth layer, a second n-type semiconductor layer, an active layer, and a p-type semiconductor layer are sequentially laminated onto the aforementioned first n-type semiconductor layer in a second organometallic chemical vapor deposition apparatus. Consequently, the first n-type semiconductor layer formed in the first step is formed in a separate chamber from the p-type semiconductor layer formed in the second step, with the result that, according to the semiconductor light-emitting element manufacturing method of the present invention, it is possible to reduce or inhibit occurrence of defects in the p-type semiconductor layer deriving from the dopant used when forming the n-type semiconductor layer.

In addition, with the semiconductor light-emitting element manufacturing method of the present invention, after forming a regrowth layer (n-type semiconductor layer) of the first n-type semiconductor layer atop the first n-type semiconductor layer in the second step, a second n-type semiconductor layer is laminated thereon. An active layer and a p-type semiconductor layer are then sequentially laminated thereon. According to this configuration, a second n-type semiconductor layer with satisfactory crystallinity is formed on the regrowth layer, obtaining a semiconductor light-emitting element that achieves high output.

With the semiconductor light-emitting element manufacturing method which is a second aspect of the present invention, in a second step, a regrowth layer of the first n-type semiconductor is formed on the first n-type semiconductor layer, and a second n-type semiconductor layer is laminated thereon. Consequently, a second n-type semiconductor layer with satisfactory crystallinity is formed on the regrowth layer. Furthermore, with the semiconductor light-emitting element manufacturing method which is a second aspect of the present invention, a light-emitting layer is grown at a pressure of 500 mbar-1013 mbar (under atmospheric pressure) within the deposition chamber of the second organometallic chemical vapor deposition apparatus in the second step. As a result, a light-emitting layer with satisfactory crystallinity is formed on a second n-type semiconductor layer with satisfactory crystallinity. Consequently, according to the semiconductor light-emitting element manufacturing method of the present invention, a semiconductor light-emitting element is obtained which achieves a higher light-emitting output than heretofore in the case where a large volume of current is applied.

With the semiconductor light-emitting element manufacturing method of the present invention, as stated above, the first n-type semiconductor layer which is formed in a first step with a much greater thickness than in a second step is formed in a separate deposition chamber, which is different the chamber used for forming the p-type semiconductor layer in the second step. Thus, according to the semiconductor light-emitting element manufacturing method of the present invention, it is possible to prevent defects in the p-type semiconductor layer deriving from the dopant used when forming the n-type semiconductor layer, thereby enabling major productivity improvements in terms of yield.

BEST MODE FOR CARRYING OUT THE INVENTION

The semiconductor light-emitting element manufacturing method is described below in detail with appropriate references to drawings. The drawings referenced in the following description are for the purpose of explaining the present invention, and the sizes, thicknesses, dimensions and the like of the various illustrated components differ from the actual dimensional relations of the semiconductor light-emitting element, lamp, and so on. The present invention is not limited to the following examples, and may be appropriately modified within a scope that does not deviate from its intent. Modifications and additions may be made to quantities, positions, sizes, numerical values, and the like.

The present invention relates to a semiconductor light-emitting element manufacturing method, lamp, electronic equipment, and mechanical apparatus. In particular, it relates to a method of manufacture of a semiconductor light-emitting element which inhibits occurrence of defects in a p-type semiconductor layer deriving from the dopant used when forming an n-type semiconductor layer and which obtains high output, and a semiconductor light-emitting element which may be optimally used when a large volume of current is applied, and which obtains high light-emitting output due to application of a large volume of current; and lamps, electronic equipment, and mechanical apparatuses which are provided with semiconductor light-emitting elements manufactured using this manufacturing method.

[Semiconductor Light-Emitting Element]

Figure 1:
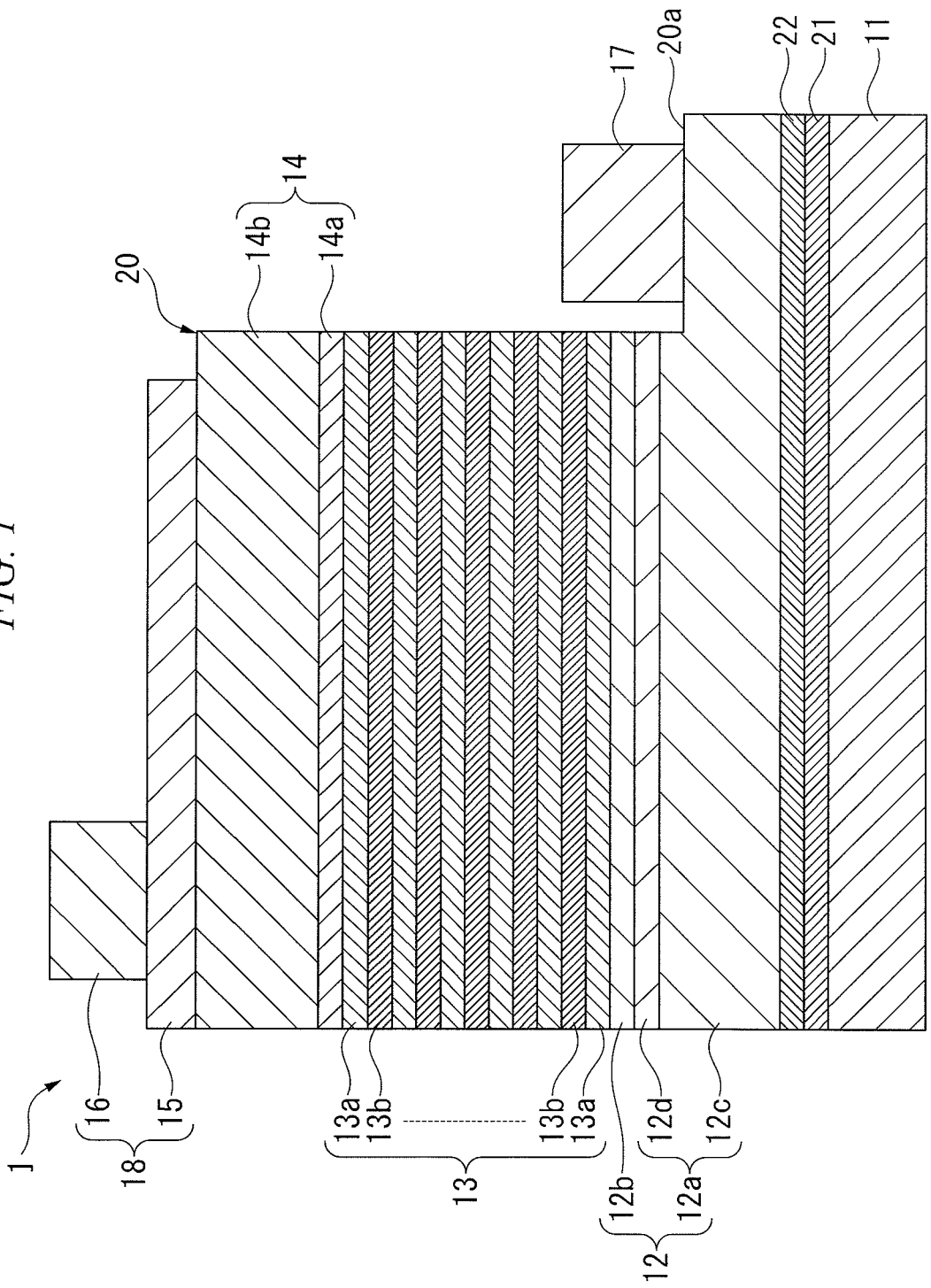
FIG. 1 is a schematic cross-sectional view which shows one example of a semiconductor light-emitting element manufactured using the semiconductor light-emitting element manufacturing method of the present invention.

FIG. 1 is a schematic cross-sectional view which shows one example of a semiconductor light-emitting element manufactured using the semiconductor light-emitting element manufacturing method of the present invention. In the present embodiment, as one example of a semiconductor light-emitting element, a description is given concerning a semiconductor light-emitting element 1 shown in FIG. 1.

The semiconductor light-emitting element 1 of the present embodiment shown in FIG. 1 is provided with a substrate 11, a laminar semiconductor layer 20 laminated onto the substrate 11, a translucent electrode 15 laminated onto a top surface of the laminar semiconductor layer 20, a p-type bonding pad electrode 16 laminated onto the translucent electrode 15, and an n-type electrode 17 laminated onto an exposed surface 20a of the laminar semiconductor layer 20.

The laminar semiconductor layer 20 is configured by lamination of an n-type semiconductor layer 12, a light-emitting layer (active layer) 13, and a p-type semiconductor layer 14 from the substrate 11 side in this order. As shown in FIG. 1, portions of the n-type semiconductor layer 12, light-emitting layer (active layer) 13, and p-type semiconductor layer 14 are removed by means such as etching, and a portion of the n-type semiconductor layer 12 is exposed from the removed portion. The n-type electrode 17 is laminated onto the exposed surface 20a of the n-type semiconductor layer 12.

Moreover, the translucent electrode 15 and p-type bonding pad electrode 16 are laminated onto a top surface 14a of the p-type semiconductor layer 14. A p-type electrode 18 is configured by this translucent electrode 15 and p-type bonding pad electrode 16.

As the semiconductor that configures the n-type semiconductor layer 12, light-emitting layer 13, and p-type semiconductor layer 14, it is preferable to use a Group III nitride semiconductor. Use of a gallium nitride compound semiconductor is more preferable. As a gallium nitride compound semiconductor, for example, a semiconductor of various compositions expressed by general formula $Al_xIn_yGa_{1-x-y}N$ ($0 \leq x < 1$, $0 \leq y < 1$, $0 \leq x+y < 1$) is known. The semiconductor of various composition represented by general formula $Al_xIn_yGa_{1-x-y}N$ ($0 \leq x < 1$, $0 \leq y < 1$, $0 \leq x+y < 1$) can be used as a gallium nitride compound semiconductor which configures the n-type semiconductor layer 12, light-emitting layer 13, and p-type semiconductor layer 14 in the present invention without any limitation.

The semiconductor light emitting element 1 of the present embodiment is configured to emit luminescence from the light-emitting layer 13 which is the active layer configuring the laminar semiconductor layer 20 by passing current between the n-type electrode 17 and the p-type electrode 18, and is a face-up mount type light-emitting element wherein the light from the light-emitting layer 13 comes out from the side where the p-type bonding pad electrode 16 is formed.

(Substrate)

The substrate 11 may be selected as desired, and one may use, for example, substrates composed of sapphire, SiC, silicon, zinc oxide, magnesium oxide, manganese oxide, zirconium oxide, zinc iron manganese oxide, aluminum magnesium oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, or the like. Among the foregoing substrates, it is particularly preferable to use a sapphire substrate whose principal surface is the c-surface.

In the aforementioned substrate, it is also possible to use an oxide substrate, a metal substrate, or the like which is known to trigger chemical modification by contact with ammonia at high temperature. A suitable method of use may be selected in such instances. For example, in the case where a below-mentioned buffer layer 21 is formed by a method which does not use ammonia and a below-mentioned ground layer 22 is formed by a method which uses ammonia, the buffer layer 21 acts as a coating layer, thereby enabling effective prevention of chemical alteration of the substrate 11.

(Buffer Layer)

A buffer layer 21 may be provided or not provided. However, it is preferable to provide it in order to mitigate differences in the lattice constants of the substrate 11 and the ground layer 22, and facilitate formation of a single-crystal layer with a c-axis orientation on the (0001) c-surface of the substrate 11. By laminating a single-crystal ground layer 22 on the buffer layer 21, it is possible to laminate a ground layer 22 that has even better crystallinity.

The buffer layer 21 is preferably composed of polycrystalline $Al_xGa_{1-x}N$ ($0 \leq x < 1$), and single-crystal $Al_xGa_{1-x}N$ ($0 \leq x \leq 1$) is more preferable. $0.5 \leq x \leq 1.0$ is more preferable.

For example, the buffer layer 21 may be composed of polycrystalline $Al_xGa_{1-x}N$ ($0 \leq x \leq 1$) with a thickness of 0.01-0.5 µm. When the thickness of the buffer layer 21 is less than 0.01 µm, it may happen that the effect of mitigating differences in the lattice constants of the substrate 11 and the ground layer 22 by the buffer layer 21 is not sufficiently obtained. When the thickness of the buffer layer 21 exceeds 0.5 µm, although there is no change in its function as a buffer layer 21, the formation treatment time of the buffer layer 21 may be lengthened, and productivity may decline.

As one preferred example of the buffer layer 21, one may cite a layer which possesses a hexagonal crystal structure composed of a Group III nitride semiconductor. It is preferable that the crystal of the Group III nitride semiconductor which constitutes the buffer layer 21 have a single-crystal structure. By controlling growth conditions, the crystal of the Group III nitride semiconductor grows not only in an upward direction, but also in an in-plane direction to form a single-crystal structure. Consequently, a buffer layer 21 composed of crystal having a single-crystal structure of Group III nitride semiconductor crystal can be formed by controlling the film formation conditions of the buffer layer 21. When the buffer layer 21 having such a single-crystal structure is formed on the substrate 11, a buffer function of the buffer layer 21 is effectively exerted, with the result that the Group III nitride semiconductor formed thereon is a crystal film having satisfactory orientation and crystallinity.

By controlling the film formation conditions, the crystal of the Group III nitride semiconductor which constitutes the buffer layer 21 can be formed as a column crystal (polycrystal) which has an aggregate structure based on a hexagonal column. A column crystal composed from this structure signifies crystal wherein crystal grain boundaries are formed between adjacent crystal grains to establish separation, and the crystal itself adopts a columnar shape in the form of a longitudinal cross-section.

(Ground Layer)

As the ground layer 22, one may cite $Al_xGa_yIn_zN$ ($0 \leq x \leq 1$, $0 \leq y \leq 1$, $0 \leq z \leq 1$, $x+y+z=1$), but given that a ground layer 22 of satisfactory crystallinity can be formed when using $Al_xGa_{1-x}N$ ($0 \leq x < 1$), this is preferable. $0 \leq x < 0.5$ is more preferable.

Film thickness of the ground layer 22 is preferably 0.1 µm or greater; more preferably 0.5 µm or greater; and most preferably 1 µm or greater. An $Al_xGa_{1-x}N$ layer of satisfactory crystallinity is easily obtainable when film thickness is at this level or greater. It is preferable that the film thickness of the ground layer 22 be 10 µm or less.

In order to ameliorate the crystallinity of the ground layer 22, it is desirable that the ground layer 22 not be doped with impurities. However, in cases where p-type or n-type conductivity is required, acceptor impurities or donor impurities can be added to the ground layer 22.

(Laminar Semiconductor Layer) (n-Type Semiconductor Layer)

The n-type semiconductor layer 12 is composed of an n-contact layer 12a (first step growth layer (first n-type semiconductor layer) and regrowth layer) and an n-clad layer 12b (second n-type semiconductor layer).

The n-contact layer 12a (n-type semiconductor layer) is a layer for providing the n-type electrode 17, and is composed of a first step growth layer 12c formed in a below-described first step, and a regrowth layer 12d formed in a below-described second step. With respect to the first step growth layer 12c and the regrowth layer 12d shown in the drawings, the thickness of the first step growth layer 12c is greater than that of the regrowth layer 12d. It is preferable that the first step growth layer 12c and the regrowth layer 12d be composed of the same material. It is also preferable that they be formed under the same conditions. It is more preferable that they be composed of the same material, and be formed under the same growth conditions. Moreover, in the present embodiment, the exposed surface 20a for providing the n-type electrode 17 is formed in the first step growth layer 12c as shown in FIG. 1. The exposed surface 20a for providing the n-type electrode 17 may be formed in the regrowth layer 12d.

The n-contact layer 12a is preferably composed of an $Al_xGa_{1-x}N$ layer ($0 \leq x < 1$, preferably $0 \leq x \leq 0.5$, and more preferably $0 \leq x \leq 0.1$), and is doped with n-type impurities (dopant). In the case where n-type impurities are contained in the n-contact layer 12a in a concentration range from $1 \times 10^{17}$ to $1 \times 10^{20}/cm^3$, and preferably from $1 \times 10^{18}$ to $1 \times 10^{19}/cm^3$, this is preferable from the standpoint of maintaining satisfactory ohmic contact with the n-type electrode 17. There are no particular limitations on the n-type impurities that may be used in the n-contact layer 12a, and one may cite, for example, Si, Ge, and Sn, among others. Si and Ge are preferable, and Si is most preferable.

Film thickness of the first step growth layer 12c which composes the n-contact layer 12a is preferably in a range from 0.5 µm to 5 µm, and more preferably from 2 µm to 4 µm. When the thickness of the first step growth layer 12c is within the aforementioned range, the crystallinity of the semiconductor is satisfactorily maintained.

Film thickness of the regrowth layer 12d is preferably in a range from 0.05 µm to 2 µm, and more preferably from 0.2 µm to 1 µm. When the film thickness of the regrowth layer 12d is 0.2 µm or greater, as described below, it is possible to reduce influence on the crystallinity of the n-contact layer 12a by suspending growth of the n-contact layer 12a at the intermediate stage of n-contact layer 12a formation (formation of the first step growth layer), removing it from the deposition chamber in the first organometallic chemical vapor deposition apparatus, moving it to the deposition chamber of another apparatus (second organometallic chemical vapor deposition apparatus), and subsequently restarting growth of the n-contact layer 12a in order to form the regrowth layer 12d. As a result, the effect of enhancement of semiconductor light-emitting element output becomes more pronounced. When thickness of the regrowth layer 12d exceeds 2 µm, large amounts of dopant and sediment remain after formation of the n-type semiconductor layer 12 in the deposition chamber of the second organometallic chemical vapor deposition apparatus used when forming the p-type semiconductor layer 14, and defects tend to occur in the p-type semiconductor layer 14 deriving from the sediment and the dopant used when forming the n-type semiconductor layer 12. Furthermore, there is the problem that film formation treatment time of the regrowth layer 12d is lengthened, and productivity declines.

The n-clad layer 12b is provided between the n-contact layer 12a and the light-emitting layer 13. The n-clad layer 12b is a layer which conducts injection of carriers into and confinement of carriers to the light-emitting layer 13. It also alleviates irregularities in the crystal lattice of the regrowth layer 12d and the light-emitting layer 13, and functions as a buffer layer of the light-emitting layer 13. The n-clad layer 12b may be selected as desired, and may be formed with, for example, AlGaN (i.e., $Al_xGa_{1-x}N$ (0≤x≤1)), GaN, GaInN (i.e., $Ga_xIn_{1-x}N$, 0≤x<1), or the like. In this description, there are cases where the compositional ratios of the respective aforementioned elements are omitted, and description is given as AlGaN, GaN, and GaInN. In the case where the n-clad layer 12b is formed with GaInN, it is, of course, desirable to make it larger than the band gap of the GaInN of the light-emitting layer 13.

In the case where the n-clad layer 12b is composed of a single layer, the thickness of the n-clad layer 12b is preferably from 5 nm to 500 nm, and more preferably from 5 nm to 100 nm. The n-type dopant concentration of the n-clad layer 12b is preferably from $1 \times 10^{17}$ to $1 \times 10^{20}/cm^3$, and more preferably from $1 \times 10^{18}$ to $1 \times 10^{19}/cm^3$. When dopant concentration is within this range, it is preferable from the standpoints of maintaining satisfactory crystallinity and lowering operating voltage of the light-emitting element.

In the present embodiment, the n-clad layer 12b may be a single layer, but a superlattice structure in which thin-film layers are repeatedly grown in multiple layers is preferable for said layer. To cite a specific example, it is preferable to have a superlattice structure in which two thin-film layers of differing composition are repeatedly grown, and which is composed of 10 pairs (20 layers) to 40 pairs (80 layers). In the case where the n-clad layer 12b is composed of a superlattice structure, when the number of laminae of thin-film layers is 20 layers or more, irregularities in the crystal lattice of the regrowth layer 12d and the light-emitting layer 13 can be more effectively alleviated, and the effect of enhancement of semiconductor light-emitting element output becomes more pronounced. However, when the number of laminae of thin-film layers exceeds 80 layers, the superlattice structure may tend to become disordered, and there is a risk of adverse effects on the light-emitting element 13. Furthermore, there is the problem that film formation treatment time of the n-clad layer 12b is lengthened, and productivity declines With respect to the superlattice structure configuring the n-clad layer 12b, it is preferable to laminate an n-side first layer composed of a Group III nitride semiconductor and an n-side second layer composed of a Group III nitride semiconductor of different composition from that of the n-side first layer, and it is more preferable to have a structure in which the n-side first layer and the n-side second layer are alternately and repeatedly laminated.

As the combination of n-side first layer and n-side second layer which configure the superlattice structure of the n-clad layer 12b, one may have an alternating structure of GaInN/GaN, an alternating structure of AlGaN/GaN, an alternating structure of GaInN/AlGaN, an alternating structure of GaInN/GaInN of mutually different composition (the description "different composition" in the present invention refers to different elemental ratios in the aforementioned two layers), and an alternating structure of AlGaN/AlGaN of mutually different composition. An alternating structure of GaInN/GaN, or an alternating structure of GaInN/GaInN of mutually different composition is preferable.

The respective thicknesses of the n-side first layer and n-side second layer are preferably 100 angstroms or less, more preferably 60 angstroms or less, and still more preferably 40 angstroms or less. The lower limit is preferably set to 10 angstroms or more. It is most preferable to set the thicknesses of both layers within a range from 10 angstroms to 40 angstroms. It is undesirable when thickness of the n-side first layer and/or n-side second layer that form the superlattice layer exceed 100 angstroms, because crystal defects tend to occur.

The aforementioned n-side first layer and n-side second layer may each have a doped structure, or may have a combined doped structure/undoped structure. As the impurities to be doped, one may apply conventional known impurities to the aforementioned material compositions without any limitation. For example, with respect to the n-clad layer 12b, Si is optimal as the impurity in the case where a superlattice structure is used which has an alternating structure of GaInN/GaN or an alternating structure of GaInN/GaInN of different composition. The n-side first layer and n-side second layer that configure the superlattice structure may have the same composition (GaInN, AlGaN, or GaN), and may also have a combined doped structure/undoped structure.

(Light-Emitting Layer)

The light-emitting layer 13 is a layer composed from a multiple quantum well structure by alternately and multiply laminating a barrier layer 13a and a well layer 13b. The number of laminae in the multiple quantum well structure may be selected as desired, but from 3 layers to 10 layers is preferable, and from 4 layers to 7 layers is more preferable.

It is preferable that the thickness of the well layer 13b be in a range from 15 angstroms or more to 50 angstroms or less. When the thickness of the well layer 13b is within the aforementioned range, higher light-emitting output is obtained.

It is preferable that the well layer 13b be a gallium nitride compound semiconductor containing In. A gallium nitride compound semiconductor containing In is preferable, because it is capable of emitting intense light in the blue wavelength region. The well layer 13b can also be doped with impurities. As dopant, it is preferable to use Si and Ge which enhance light-emitting intensity. With respect to the dopant amount, $1 \times 10^{17}$ cm$^{-3}$ to $1 \times 10^{18}/cm^{-3}$ is optimal. If this is exceeded, it may trigger a decline in light-emitting intensity.

The thickness of the barrier layer 13a is preferably in a range from 20 angstroms or more to less than 100 angstroms. When thickness of the barrier layer 13a is excessively thin, it may impede planarization of a top surface of the barrier layer 13a, and may cause a reduction in light-emitting efficiency and deterioration in aging properties. When thickness of the barrier layer 13a is excessively thick, it may cause a rise in drive voltage and a reduction in light emission. Consequently, thickness of the barrier layer 13a is preferably 70 angstroms or less.

In addition to GaN and AlGaN, the barrier layer 13a may be formed with InGaN in which the proportion of 1n is less than in the InGaN configuring the well layer. Among these, GaN is optimal.

(p-Type Semiconductor Layer)

The p-type semiconductor layer 14 is ordinarily configured from a p-clad layer 14a and a p-contact layer 14b. The p-contact layer 14b can also function as the p-clad layer 14a.

The p-clad layer 14a is a layer which performs confinement of carriers to and injection of carriers into the light-emitting layer 13. The p-clad layer 14a has a composition which has a larger band gap energy than that of the light-emitting layer 13, and is not particularly limited as long as it can perform confinement of carriers to the light-emitting layer 13, but is preferably a layer composed of $Al_xGa_{1-x}N$ ($0<x\le0.4$). The p-clad layer 14a is preferably composed of this type of AlGaN in view of confinement of carriers to the light-emitting layer 13.

The thickness of the p-clad layer 14a is not particularly limited, but is preferably from 1 nm to 400 nm, and more preferably from 5 nm to 100 nm. The p-type dopant concentration of the p-clad layer 14a is preferably from $1\times10^{18}$ to $1\times10^{21}/cm^3$, and more preferably from $1\times10^{19}$ to $1\times10^{20}/cm^3$. When the p-type dopant concentration is within the above range, a satisfactory p-type crystal is obtained without causing deterioration of crystallinity. The p-clad layer 14a may have a superlattice structure having multiple laminations of thin film.

When the p-clad layer 14a contains a superlattice structure, it may be formed from a structure in which, for example, a p-side first layer composed of a Group III nitride semiconductor and a p-side second layer composed of a Group III nitride semiconductor that has a composition different from that of the aforementioned p-side first layer are laminated. Alternatively, when the p-clad layer 14a contains a superlattice structure, the p-clad layer 14a may have a structure in which p-side first layers and p-side second layers are alternately and repeatedly laminated.

The p-side first layer and p-side second layer that configure the superlattice structure of the p-clad layer 14a may have respectively different compositions. For example, the p-side first layer and p-side second layer may be selected from among AlGaN, GaInN, and GaN. Among these, any composition is acceptable. To cite specific examples, it may have an alternating structure of GaInN/GaN, an alternating structure of AlGaN/GaN, or an alternating structure of GaInN/AlGaN. In the present invention, the p-side first layer and the p-side second layer are preferably an alternating structure of AlGaN/GaN or AlGaN/AlGaN.

The respective thicknesses of the p-side first layer and the p-side second layer are preferably 100 angstroms or less, more preferably 60 angstroms or less, and still more preferably 40 angstroms or less. It is preferable to set the lower limit at 10 angstroms or more. It is most preferable to have the respective thicknesses of the p-side first layer and the p-side second layer within a range from 10 angstroms to 40 angstroms. It is undesirable when the thickness of the p-side first layer and the p-side second layer that form the superlattice layer exceeds 100 angstroms, as crystal defects are likely to occur.

The p-side first layer and the p-side second layer may each have a doped structure, or a combination of doped structure/undoped structure. As the impurities to be doped, one may apply conventionally known impurities to the aforementioned material composition without any limitation. For example, when using a superlattice structure having an alternating structure of AlGaN/GaN or an alternating structure of AlGaN/AlGaN of different composition as the p-clad layer, Mg is optimal as the impurity. Moreover, the p-side first layer and p-side second layer that configure the superlattice structure may be formed from identical compounds of identical composition (GaInN, AlGaN, or GaN), and may form a combined form of a doped structure/undoped structure.

The p-contact layer 14b is a layer for providing a positive electrode. The p-contact layer 14b is preferably $Al_xGa_{1-x}N$ ($0\le x\le0.4$). $0\le x\le0.1$ is more preferable. It is preferable when Al composition is within the aforementioned range from the standpoints of maintaining satisfactory crystallinity and satisfactory ohmic contact with a p-ohmic electrode. Moreover, it is preferable when the p-contact layer 14b contains p-type impurities (dopant) in a concentration from $1\times10^{18}$ to $1\times10^{21}/cm^3$, and preferably from $1\times10^{19}$ to $1\times10^{20}/cm^3$, from the standpoints of maintaining satisfactory ohmic contact, preventing occurrence of cracking, and maintaining satisfactory crystallinity. There is no particular limitation on p-type impurities, and they may be selected as desired. For example, Mg may be preferentially cited. There is no particular limitation on the thickness of the p-contact layer 14b, and it is preferably from 0.01 μm to 0.5 and more preferably from 0.05 μm to 0.2 μm. It is preferable when the thickness of the p-contact layer 14b is within the aforementioned ranges from the standpoint of light-emitting output.

(n-Type Electrode)

The n-type electrode 17 also functions as a bonding pad, and is formed so as to adjoin the n-type semiconductor layer 12 of the laminar semiconductor layer 20. Consequently, when the n-type electrode 17 is formed, a portion of the light-emitting layer 13 and the p-type semiconductor layer 14 are removed to expose the n-type semiconductor layer 12, and the n-type electrode 17 which also functions as a bonding pad is formed on an exposed surface 20a of the n-type semiconductor layer 12. As the n-type electrode 17, various compositions and structures are widely known, and these well-known compositions and structures can be used without any limitation, and can be provided by commonly used means that are well known in the relevant technical field.

(Translucent Electrode)

The translucent electrode 15 is laminated onto the p-type semiconductor layer 14, and may be selected as desired, but preferably has low contact resistance with the p-type semiconductor layer 14. In order to efficiently extract light from the light-emitting layer 13 to the exterior of the semiconductor light-emitting element 1, it is preferable that the translucent electrode 15 have excellent light transmission properties. In addition, in order to uniformly diffuse current over the entire surface of the p-type semiconductor layer 14, it is preferable that the translucent electrode 15 have excellent conductivity.

As the constituent material of the translucent electrode 15, one may preferentially cite translucent conductive material selected from a group composed of chromium sulfide, zinc sulfide, and a conductive oxide containing any one of In, Zn, Al, Ga, Ti, Bi, Mg, W and Ce. As the aforementioned conductive oxide, one may preferentially cite ITO (indium tin oxide ($In_2O_3$—$SnO_2$)), IZO (indium zinc oxide ($In_2O_3$—ZnO)), AZO (aluminum zinc oxide (ZnO—$Al_2O_3$)), GZO (gallium zinc oxide (ZnO—$Ga_2O_3$)), fluorine-doped tin oxide, titanium oxide, and so on. These materials may be formed by employing commonly used means that are well known in the relevant technical field to produce the translucent electrode 15.

In the present invention, with respect to the structure of the translucent electrode 15, any structure including conventionally known structures may be used without limitation. Moreover, the translucent electrode 15 may be formed so as to cover almost the entire surface of the p-type semiconductor layer 14, and may be formed in a grid-like or ramified manner with interstitial openings.

(p-Type Bonding Pad Electrode)

The p-type bonding pad electrode 16 also functions as a bonding pad, and is laminated onto the translucent electrode 15. As the p-type bonding pad electrode 16, various compositions and structures are widely known, and these well-known compositions and structures can be used without any limitation, and can be provided by commonly used means that are well known in the relevant technical field.

The p-type bonding pad electrode 16 may be formed anywhere so long as it is on the translucent electrode 15. For example, it may be formed at a position that is farthest removed from the n-type electrode 17, or it may be formed at the center or the like of the semiconductor light-emitting element 1. However, it is undesirable to form it at a position that is too close to the n-type electrode 17, as short circuits between wires or balls would occur at the time of bonding.

With respect to the electrode area of the p-type bonding pad electrode 16, bonding work is facilitated by making it as large as possible, but this is an obstacle to extraction of emitted light. For example, when it covers a wide area that exceeds half the area of the chip surface, this becomes an obstacle to extraction of emitted light, and output markedly declines. Conversely, when the electrode area of the p-type bonding pad electrode 16 is excessively small, bonding work is inhibited, and product yield is reduced. Specifically, an area slightly larger than the diameter of the bonding ball is preferable as the electrode, and a circular extent of 100 μm diameter is usual.

(Protective Film Layer)

A protective film layer may be formed as necessary so as to cover the top surface and side surfaces of the translucent electrode 15, the exposed surface 20a of the n-type semiconductor layer 12, the side surfaces of the light-emitting layer 13, and the p-type semiconductor layer 14, and the side surfaces and peripheries of the p-type bonding pad electrode 16 and n-type electrode 17. By forming a protective film layer, it is possible to prevent infiltration of moisture and the like into the interior of the semiconductor light-emitting element 1, and inhibit degradation of the semiconductor light-emitting element 1.

The protective layer may be selected as desired, but preferably uses material which has insulating properties, and which has transmissivity of 80% or more at wavelengths in a range from 300 nm to 550 nm. For example, one may use silicon oxide ($SiO_2$), aluminum oxide ($Al_2O_3$), niobium oxide ($Nb_2O_5$), tantalum oxide ($Ta_2O_5$), silicon nitride ($Si_3N_4$), aluminum nitride (AlN), and the like. Among these, $SiO_2$ and $Al_2O_3$ are more preferable in that a fine film can be easily fabricated by CVD film formation.

[Method of Manufacture of Semiconductor Light-Emitting Element]

Figure 2:
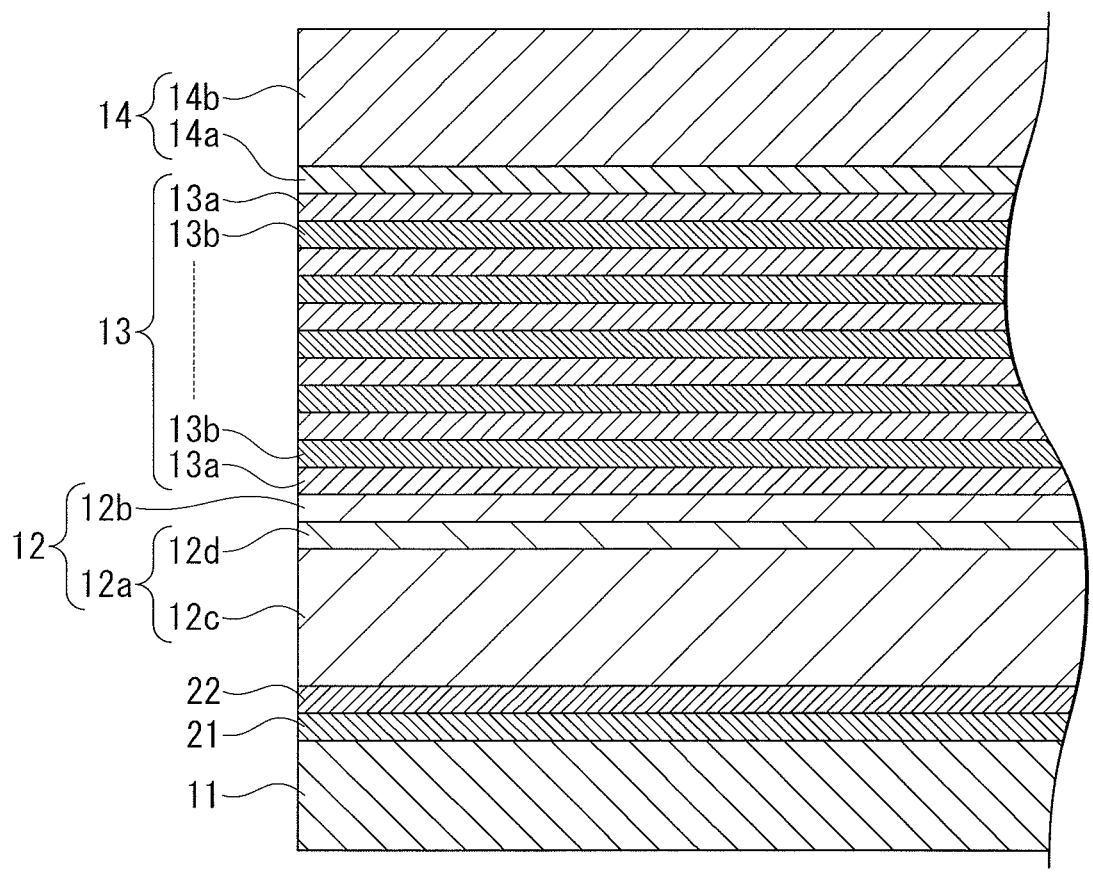
FIG. 2 is a schematic cross-sectional view that serves to explain the steps in manufacturing the semiconductor light-emitting element shown in FIG. 1.

In order to manufacture the semiconductor light-emitting element 1 shown in FIG. 1, first, the laminar semiconductor layer 20 shown in FIG. 2 is manufactured. To manufacture the laminar semiconductor layer 20 shown in FIG. 2, a substrate 11 such as a sapphire substrate is first prepared.

Next, the substrate 11 is installed in a deposition chamber of a first MOCVD (metal organic chemical vapor deposition) apparatus, and the buffer layer 21, ground layer 22, and first step growth layer 12c that configures a portion of the n-contact layer 12a (n-type semiconductor layer) are sequentially laminated onto the substrate 11 by the MOCVD method (first step).

When the first step growth layer 12c is grown, the substrate 11 is preferably set to a temperature within a range from 1000° C. to 1100° C., and more preferably on the order of 1080° C. It is preferable to conduct growth in a hydrogen atmosphere.

As the raw materials from which the first step growth layer 12c is grown, an organic metal raw material of Group III metals such as trimethyl gallium (TMG) and a nitrogenous raw material such as ammonia ($NH_3$) can be cited. Using the raw materials, a Group III nitride semiconductor layer can be deposited on the buffer layer by thermal decomposition. Pressure within the deposition chamber of the MOCVD apparatus is preferably set to 15-80 kPa, and 15-60 kPa is more preferable. The carrier gas may be selected as desired. It is acceptable to use hydrogen gas alone, and it is also acceptable to use a gas mixture of hydrogen gas and nitrogen gas.

Subsequently, the substrate 11 on which the respective layers until the first step growth layer 12c of the n-contact layer 12a have been formed is removed from the deposition chamber of first MOCVD apparatus.

Next, the substrate 11 on which the respective layers until the first step growth layer 12c have been formed is set up in the deposition chamber of the second MOCVD apparatus. Using the MOCVD method, the regrowth layer 12d of the n-contact layer 12a, the n-clad layer 12b (second n-type semiconductor layer), the light-emitting layer 13, and the p-type semiconductor layer 14 are sequentially laminated in this order onto the first step growth layer 12c (second step).

With respect to the present embodiment, in the second step, it is preferable before formation of the regrowth layer 12d to subject the substrate 11 on which the respective layers until the first step growth layer 12c have been formed to heat treatment at a heat treatment temperature of 500° C.-1000° C. in an atmosphere containing nitrogen and ammonia in the deposition chamber of the second MOCVD apparatus. Instead of an atmosphere containing nitrogen and ammonia, the heat treatment atmosphere may also, for example, be an atmosphere of nitrogen only. A hydrogen-only atmosphere is undesirable, because the first step growth layer 12c sublimates, leading to deterioration in crystallinity. With respect to heat treatment, pressure in the deposition chamber of the MOCVD apparatus is preferably 15-100 kPa, and more preferably 60-95 kPa.

When this type of heat treatment is conducted in the second step, even if the surface of the first step growth layer 12c has been contaminated by removal of the substrate 11 on which the respective layers until the first step growth layer 12c of the n-contact layer 12a have been formed from the deposition chamber of the first MOCVD apparatus after termination of the first step, the contaminants can be eliminated prior to formation of the regrowth layer 12d. As a result, the crystallinity of the regrowth layer 12d is improved, and the crystallinity of the n-clad layer 12b and the light-emitting layer 13 formed on the regrowth layer 12d becomes even better. In the case where the surface of the first step growth layer 12c remains contaminated, there is a risk that reverse current (IR) may be insufficiently low, and that electrostatic discharge (ESD) resistance may be inadequate, which may result in reduced reliability of the semiconductor light-emitting element 1.

Moreover, with respect to the present embodiment, it is preferable that the growth conditions for the first step growth layer 12c in the first step and the growth conditions for the regrowth layer 12d in the second step be identical. In this case, effects on the crystallinity of the n-contact layer 12a can be mitigated, even when two apparatuses which are the first MOCVD apparatus and the second MOCVD apparatus are used by interrupting the growth of the n-contact layer 12a at an intermediate stage in the formation of the n-contact layer 12a (formation of the first step growth layer) in the first MOCVD apparatus; conducting removal of the substrate from the deposition chamber of the first MOCVD apparatus to transport it to the deposition chamber of the second MOCVD apparatus; and subsequently restarting growth of the n-contact layer 12a for purposes of forming the regrowth layer. Consequently, the crystallinity of the n-contact layer 12a composed of the first step growth layer 12c and the regrowth layer 12d is satisfactory. Making growth conditions identical as mentioned above signifies that growth is conducted upon setting identical conditions with respect to, for example, temperature, pressure, gas flow rate, or the like.

In the present embodiment, the thickness of the regrowth layer 12d is preferably from 0.05 μm to 2 μm.

When the regrowth layer 12d is grown, the temperature of the substrate 11 is preferably set within a range from 1000° C. to 1100° C. By setting the temperature of the substrate 11 within the aforementioned range when growing the regrowth layer 12d, even when the surface of the first step growth layer 12c of the n-contact layer 12a is contaminated when the substrate 11 on which the respective layers until the first step growth layer 12c have been formed is removed from the deposition chamber of the first MOCVD apparatus, the contaminants can be eliminated when forming the regrowth layer 12d. As a result, the crystallinity of the n-clad layer 12b and the light-emitting layer 13 formed on the regrowth layer 12d can be further improved. In contrast, in the case where the temperature of the substrate 11 is less than 1000° C. when growing the regrowth layer 12d, reverse current (IR) may be insufficiently low, and electrostatic discharge (ESD) resistance may be inadequate. In the case where the temperature of the substrate 11 exceeds 1100° C. when growing the regrowth layer 12d, the output of the semiconductor light-emitting element 1 may be insufficient.

In the second step, it is preferable that an n-clad layer 12b be formed which is composed of a superlattice structure constituted by repeatedly growing 20-80 thin-film layers, and preferably 20-40 thin-film layers. In the case where the n-clad layer 12b is configured as a superlattice structure, it is preferable to alternately and repeatedly laminate an n-side first layer with a film thickness of 100 angstroms or less composed of a Group III nitride semiconductor and an n-side second layer with a film thickness of 100 angstroms or less composed of a Group III nitride semiconductor of different composition from that of the n-side first layer, and form thin-film layers so as to constitute 20-80 layers, and preferably constitute 20-40 layers.

With respect to the light-emitting layer 13, the barrier layer 13a and the well layer 13b may be alternately and repeatedly laminated, and may be arranged so that the barrier layer 13a is disposed on the n-type semiconductor layer 12 side and the p-type semiconductor layer 14 side. That is, as shown in the drawings, the light-emitting layer 13 may be formed by lamination so that a barrier layer 13a contacts the n-type semiconductor layer 12 and so that a barrier layer 13a contacts the p-type semiconductor layer 14. The composition and thickness of the barrier layer 13a and the well layer 13b are set so as to achieve a prescribed light-emitting wavelength. The growth temperature of the light-emitting layer 13, for example, can be preferably set to 600-900° C., and nitrogen gas, for example, can be preferably used as the carrier gas. When growing the barrier layer 13a and the well layer 13b, conditions such as the pressure of the deposition chamber and the flow rate of the carrier gas can be made identical for the barrier layer 13a and the well layer 13b.

In the present embodiment, the pressure of the deposition chamber in the second MOCVD apparatus when growing the light-emitting layer 13 is preferably 500 mbar to 1013 mbar (in atmospheric pressure) (50-101.3 kPa). The pressure in the deposition chamber of the second MOCVD apparatus is more preferably set to 600 mbar or higher. Moreover, the pressure of the deposition chamber in the second MOCVD apparatus is preferably set to 900 mbar or less, and more preferably to 800 mbar or less.

By setting the pressure of the deposition chamber to 500 mbar or more, the crystallinity of the light-emitting layer 13 becomes even better, a light-emitting layer 13 of satisfactory crystallinity is formed on an n-clad layer 12b of satisfactory crystallinity, and a semiconductor light-emitting element 1 which achieves higher light-emitting output than previously is obtained when a large volume of current is applied. This effect becomes more pronounced when a large volume of current of 70 mA or more is applied. By setting the pressure of the deposition chamber to 1013 mbar or less, irregularities in light-emitting intensity in the plane of the substrate 11 before division (chipping) of the substrate 11 are kept sufficiently small, and the quality of the obtained semiconductor light-emitting element 1 becomes uniform. The flow rate of the carrier gas may be selected as desired.

In the present embodiment, when growing the light-emitting layer 13, it is preferable to supply a Group III raw material containing a Group III element together with a first carrier gas at a flow rate of 30-100 SLM to the deposition chamber of the second MOCVD apparatus, while simultaneously supplying a nitrogenous raw material containing nitrogen or a nitrogen compound together with a second carrier gas to the aforementioned deposition chamber to grow a light-emitting layer 13 composed of a Group III nitride semiconductor layer. As the Group III element, one may cite, for example, Ga. As the second carrier gas, nitrogen gas is preferably used. As the nitrogen compound, one may cite ammonia ($NH_3$).

The growth temperature of the light-emitting layer 13 is preferably set to 600-900° C.

The pressure of the deposition chamber when growing the light-emitting layer 13 using a reduced-pressure CVD apparatus is ordinarily on the order of 400 mbar. In the present embodiment, as the pressure of the deposition chamber when growing the light-emitting layer 13 is set to 500 mbar or higher, the crystallinity of the light-emitting layer 13 is satisfactory. However, compared to the case where pressure is set to 400 mbar, irregularities in light-emitting intensity in the plane of the substrate 11 before division (chipping) of the substrate 11 tend to be large, and irregularities in the quality of the obtained semiconductor light-emitting element 1 tend to be somewhat large.

As stated above, when a Group III raw material containing a Group III element is supplied to the deposition chamber together with a first carrier gas that is controlled to a flow rate of 30-100 SLM, as the flow rate of the first carrier gas is appropriate, the Group III raw material tends to uniformly spread over the entire surface of the substrate 11 prior to its division (chipping) before the reaction of the Group III raw material and the nitrogen raw material proceeds in the deposition chamber. As a result, irregularities in light-emitting intensity in the plane of the substrate 11 prior to division (chipping) of the substrate 11 can be more effectively inhibited.

The flow rate of the first carrier gas that is supplied to the deposition chamber is more preferably set to 40 SLM or higher. Moreover, the flow rate of the first carrier gas that is supplied to the deposition chamber is more preferably set to 70 SLM or less.

With respect to the p-type semiconductor layer 14, a p-clad layer 14a and a p-contact layer 14b may be sequentially laminated. In the case where the p-clad layer 14a is a layer containing a superlattice structure, a p-side first layer with a film thickness of 100 angstroms or less composed of a Group III nitride semiconductor and a p-side second layer with a film thickness of 100 angstroms or less composed of a Group III nitride semiconductor, which has different composition from that of the p-side first layer, may be alternately and repeatedly laminated.

The laminar semiconductor layer 20 shown in FIG. 2 is manufactured in the foregoing manner.

In the present invention, the film thickness from the regrowth layer 12d to the p-type semiconductor layer 14 laminated in the second step can be formed much thinner than the film thickness from the buffer layer 21 to the first step growth layer 12c or from the ground layer 22 to the first step growth layer 12c laminated in the first step. Moreover, in contrast to a case wherein the entire semiconductor layers are formed in a deposition chamber of a single MOCVD (metal organic chemical vapor deposition) apparatus, it is possible to prevent defects in the p-type semiconductor layer which derive from the dopant used when forming the n-type semiconductor layer.

A transparent material layer constituting the translucent electrode 15 is then laminated onto the p-type semiconductor layer 14 of the laminar semiconductor layer 20, and, for example, the translucent electrode 15 is formed by removing the transparent material layer outside of a prescribed region by a commonly known photolithography technique.

Thereafter, patterning is conducted using, for example, a photolithography technique, and a portion of the laminar semiconductor layer 20 is subjected to etching in a prescribed region to expose a portion of the first step growth layer 12c of the n-contact layer 12a, and forming the n-type electrode 17 on the exposed surface 20a of the n-contact layer 12a.

Subsequently, the p-type bonding pad electrode 16 is formed on the translucent electrode 15.

Subsequently, the semiconductor light-emitting element 1 shown in FIG. 1 is manufactured by dividing (chipping) the substrate 11.

With the method of manufacture of the semiconductor light-emitting element 1 of the present embodiment, in the second step, an n-clad layer 12b is laminated onto the n-contact layer 12a after formation of the regrowth layer 12d of the n-contact layer 12a, with the result that an n-clad layer 12b of satisfactory crystallinity is formed on the regrowth layer 12d. Furthermore, in the second step, if the light-emitting layer 13 is grown with a pressure of 500-1013 mbar in the deposition chamber of the second MOCVD apparatus, it is possible to form a light-emitting layer 13 of satisfactory crystallinity on the n-clad layer 12b of satisfactory crystallinity. As a result, according to the semiconductor light-emitting element manufacturing method of the second aspect, a semiconductor light-emitting element 1 is obtained which achieves high light-emitting output by application of a large volume of current.

According to the method of manufacture of the semiconductor light-emitting element 1 of the present embodiment, there is a first step in which the first step growth layer 12c of the n-contact layer 12a is laminated onto the substrate 11 in the first MOCVD apparatus, and a second step in which the regrowth layer 12d of the n-contact layer 12a, the n-clad layer 12b, the light-emitting layer 13, and the p-type semiconductor layer 14 are sequentially laminated onto the first step growth layer 12c in the second MOCVD apparatus. That is, the first step growth layer 12c formed in the first step is formed in a deposition chamber which is different from the chamber used for forming the p-type semiconductor layer 14 formed in the second step. Consequently, according to the semiconductor light-emitting element manufacturing method of the present invention which includes the aforementioned first step and second step, it is possible to inhibit occurrence of defects in the p-type semiconductor layer 14 which derive from the dopant used when forming the n-type semiconductor layer 12, and obtain a semiconductor light-emitting element with sufficiently low reverse current (IR) and with excellent electrostatic discharge (ESD) resistance.

In addition, in the semiconductor light-emitting element manufacturing method of the present invention, since the n-clad layer 12b, light-emitting layer 13, and p-type semiconductor layer 14 are sequentially laminated after formation of the regrowth layer 12d on the first step growth layer 12c in the second step, a semiconductor light-emitting element 1 is obtained which can achieve high output.

[Lamp]

The lamp of the present embodiment is provided with the semiconductor light-emitting element of the present invention, and is a lamp which combines the aforementioned semiconductor light-emitting element and fluorescent material. The lamp of the present embodiment may be given a configuration well known to those skilled in the art by means well known to those skilled in the art. Moreover, in the present invention, technologies which vary emission color by the combination of the semiconductor light-emitting element and fluorescent material may be adopted without any limitation.

Figure 3:
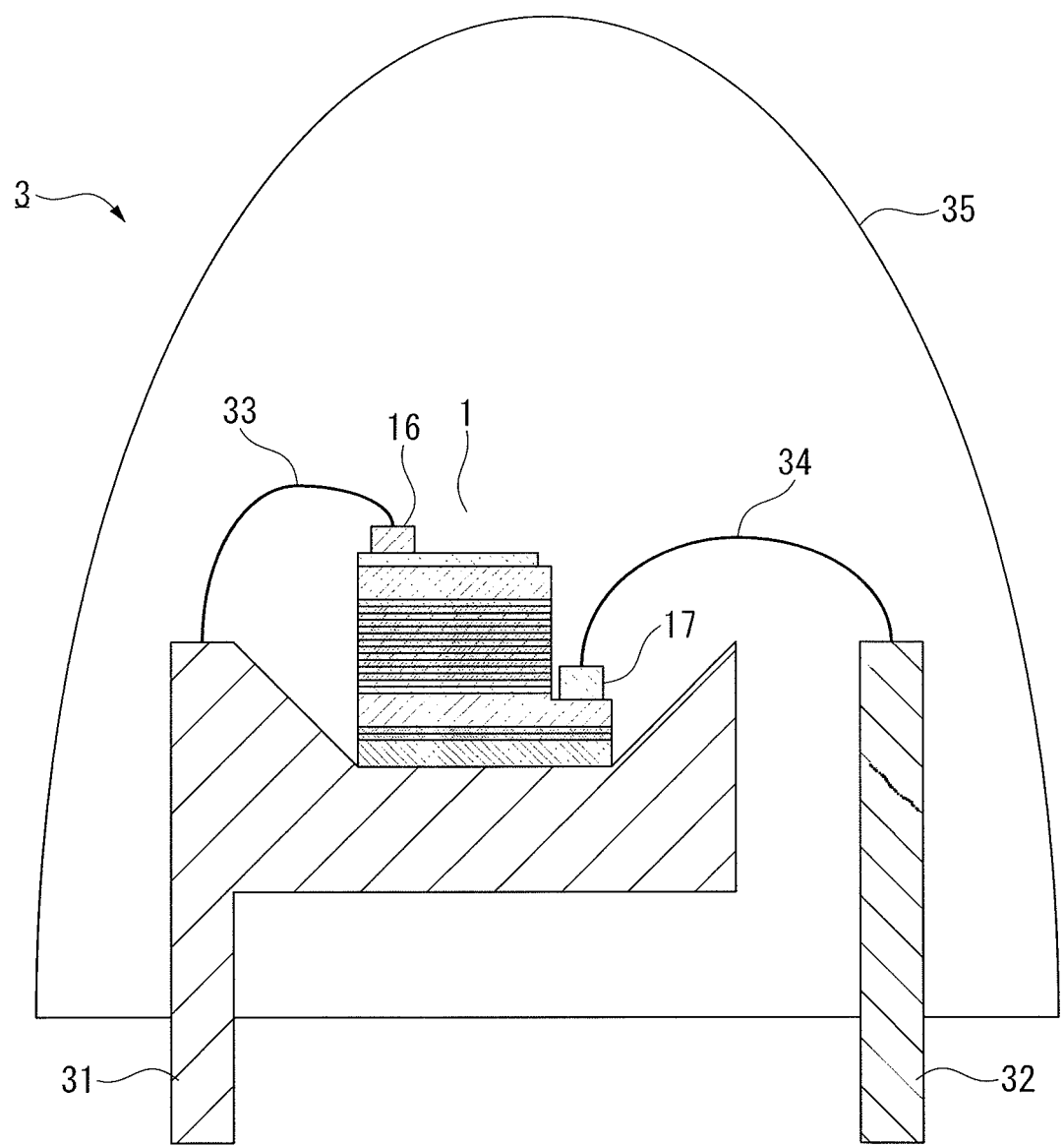
FIG. 3 is a schematic cross-sectional view which shows one example of a lamp provided with the semiconductor light-emitting element shown in FIG. 1.

FIG. 3 is a schematic cross-sectional view which shows one example of a lamp provided with the semiconductor light-emitting element 1 shown in FIG. 1. The lamp 3 shown in FIG. 3 is a shell-type lamp, and uses the semiconductor light-emitting element 1 shown in FIG. 1. As shown in FIG. 3, the semiconductor light-emitting element 1 is mounted by bonding the p-type bonding pad electrode 16 of the semiconductor light-emitting element 1 to one of two frames 31 and 32 (frame 31 in FIG. 3) by a wire 33, and by joining the n-type electrode 17 (bonding pad) of the semiconductor light-emitting element 1 to the other frame 32 by a wire 34. The periphery of the semiconductor light-emitting element 1 is sealed by a mold 35 composed of transparent resin.

As the lamp 3 of the present embodiment uses the aforementioned semiconductor light-emitting element 1, it achieves high output, and is provided with excellent light-emitting properties.

Moreover, electronic equipment such as backlights, cell phones, displays, various types of panels, computers, gaming machines and lighting which incorporate the lamp 3 of the present embodiment, as well as mechanical apparatuses such as automobiles which incorporate such electronic equipment, can be products provided with the semiconductor light-emitting element 1, which can achieve high light-emitting output, i.e., excellent light-emitting properties. Particularly with respect to battery-driven electronic equipment such as backlights, cell phones, displays, gaming machines, and lighting, it is possible to offer superior products furnished with the semiconductor light-emitting element 1 having excellent light-emitting properties, which is desirable.

EXAMPLES

Examples of the First Aspect

Example 1

The semiconductor light-emitting element 1 shown in FIG. 1 was manufactured by the method shown below.

In the manufacture of the semiconductor light-emitting element 1 of Example 1, first, a buffer layer 21 composed of AlN, a ground layer 22 of 5 μm thickness composed of undoped GaN, an n-contact layer 12a of 3.2 μm thickness composed from a first step growth layer 12c of 3 μm thickness composed of Si-doped n-type GaN and a regrowth layer 12d of 0.2 μm thickness composed of Si-doped n-type GaN, an n-clad layer 12b of superlattice structure with a thickness of 80 nm constituted by repeatedly growing thin-film layers composed of an n-side first layer of 2 nm thickness composed of GaInN and an n-side second layer of 2 nm thickness composed of GaN in the amount of 20 layers (number of pairs), a light-emitting layer 13 of multiple quantum well structure in which an Si-doped GaN barrier layer of 5 nm thickness and an $In_{0.15}Ga_{0.85}N$ well layer of 3.5 nm thickness are laminated 6 times with final provision of a barrier layer, a p-clad layer 14a of 0.01 μm thickness composed of an Mg-doped single layer of $Al_{0.07}Ga_{0.93}N$, and a p-contact layer 14b of 0.15 μm thickness composed of Mg-doped p-type GaN are sequentially laminated onto a substrate 11 composed of sapphire that is circular in the planar view to obtain the laminate.

With the semiconductor light emitting element 1 of Example 1, the buffer layer 21, ground layer 22, and first step growth layer 12c are laminated using the first MOCVD apparatus (first step). The regrowth layer 12d, n-clad layer 12b, light-emitting layer 13, p-clad layer 14a, and p-contact layer 14b are laminated using the second MOCVD apparatus (second step).

The first step growth layer 12c and the regrowth layer 12d are grown under the growth conditions shown below. The n-clad layer 12b is also grown under the growth conditions shown below. In addition, in Example 1, heat treatment is conducted under the heat treatment conditions shown below prior to formation of the regrowth layer.

[Film Formation Conditions of First Step Growth Layer 12c]

Film formation was performed at a substrate temperature of 1080° C., using trimethyl gallium (TMG) and ammonia ($NH_3$), and with setting of pressure in the deposition chamber to 20 kPa under a hydrogen atmosphere. The amount of ammonia was regulated so that the mol ratio of the Group V raw material and the Group III raw material (V/III)—i.e., the mol ratio of ammonia to trimethyl gallium—was 400.

[Film Formation Conditions of Regrowth Layer 12d]

Film formation was performed at a substrate temperature of 1080° C., using trimethyl gallium (TMG) and ammonia ($NH_3$), and with setting of pressure in the deposition chamber to 20 kPa under a hydrogen atmosphere. The amount of ammonia was regulated so that the mol ratio of Group V and Group III (V/III)—i.e., the mol ratio of ammonia to trimethyl gallium—was 400.

[Growth Conditions of the n-Clad Layer 12b]

Film formation was conducted using trimethyl gallium (TMG), trimethyl indium (TMI) and ammonia ($NH_3$), and with setting of substrate temperature to 750° C. and pressure in the deposition chamber to 40 kPa. Nitrogen gas was used as the carrier gas.

[Heat Treatment Conditions]

Heat treatment was conducted for 10 minutes at a substrate temperature of 950° C. in an atmosphere in which nitrogen gas and ammonia were circulated at a volume ratio of 9:1, with setting of pressure in the deposition chamber to 95 kPa.

Subsequently, a translucent electrode 15 of 200 nm thickness composed of ITO was formed on the p-contact layer 14b of the aforementioned laminate by a commonly known photolithography technique.

Next, etching was conducted using a photolithography technique, an exposed surface 20a of the n-contact layer 12a was formed in a desired region, and an n-type electrode 17 of Ti/Au double-layer structure was formed thereon.

In addition, a p-type bonding pad structure 16 of triple-layer structure composed of a metal reflective layer composed of Al of 200 nm, a barrier layer composed of Ti of 80 nm, and a bonding layer composed of Au of 1100 nm was formed on the translucent electrode 15 using a photolithography technique.

The semiconductor light-emitting element 1 of Example 1 configured as shown in FIG. 1 was obtained in the foregoing manner.

With respect to the semiconductor light-emitting element 1 of Example 1 obtained in this manner and of Examples 2-11 obtained as shown below, the carrier concentration of the first step growth layer 12c and the regrowth layer 12d was $8 \times 10^{18}/cm^{-3}$, the carrier concentration of the n-clad layer 12b was $5 \times 10^{18}/cm^{-3}$, the carrier concentration of the p-contact layer 14b was $5 \times 10^{18}/cm^{-3}$, and the Mg doping amount of the p-clad layer 14a was $5 \times 10^{19}/cm^{-3}$.

Example 2

The semiconductor light-emitting element 1 was obtained in the same manner as Example 1, except that the n-clad layer 12b was composed of a single-layer structure of $Ga_{0.99}In_{0.01}N$.

Example 3

The semiconductor light-emitting element 1 was obtained in the same manner as Example 1, except that the number of laminae of thin-film layers of the n-clad layer 12b was 30 layers (30 pair layers (60 layers)).

Example 4

The semiconductor light-emitting element 1 was obtained in the same manner as Example 1, except that the number of laminae of thin-film layers of the n-clad layer 12b was 40 layers.

Example 5

The semiconductor light-emitting element 1 was obtained in the same manner as Example 1, except that film thickness of the regrowth layer was set at 0.4 μm.

Example 6

The semiconductor light-emitting element 1 was obtained in the same manner as Example 1, except that film thickness of the regrowth layer was set at 0.6 μm.

Example 7

The semiconductor light-emitting element 1 was obtained in the same manner as Example 1, except that film thickness of the regrowth layer was set at 1 μm.

Example 8

The semiconductor light-emitting element 1 was obtained in the same manner as Example 1, except that heat treatment was not conducted prior to formation of the regrowth layer.

Example 9

The semiconductor light-emitting element 1 was obtained in the same manner as Example 1, except that the number of laminae of thin-film layers of the n-clad layer 12b was 10 layers.

Example 10

The semiconductor light-emitting element 1 was obtained in the same manner as Example 1, except that film thickness of the regrowth layer was set at 2 μm.

Example 11

The semiconductor light-emitting element 1 was obtained in the same manner as Example 1, except that film thickness of the regrowth layer was set at 0.05 μm.

Comparative Example 1

The semiconductor light-emitting element 1 was obtained in the same manner as Example 1, except that the respective layers from the buffer layer 21 to the p-contact layer 14b were continuously laminated (consecutively grown) using one MOCVD apparatus.

Comparative Example 2

The semiconductor light-emitting element 1 was obtained in the same manner as Example 1, except that a regrowth layer was not provided.

With respect to the semiconductor light-emitting elements of Examples 1-11 and comparative examples 1 and 2 obtained in this manner, forward voltage at a current application value of 20 mA was measured by energization with a probe needle.

Moreover, the semiconductor light-emitting elements of Examples 1-11 and comparative examples 1 and 2 were mounted on a TO-18 can package, and light-emitting output (Po) was measured by tester at an applied current of 20 mA.

Moreover, with respect to the semiconductor light-emitting elements of Examples 1-11 and comparative examples 1 and 2, reverse current (IR) and electrostatic discharge (ESD) resistance were measured by the methods shown below.

With respect to reverse current (IR), leakage current was measured when 20 V were applied with the terminal in the reverse direction relative to the light-emitting element. Electrostatic discharge (ESD) resistance was measured in conformity with EIAJED-470 (HMM) Test Method 304: Human Body Model Electrostatic Breakdown Test Method.

The results for forward voltage, light-emitting output (Po), reverse current (IR), and electrostatic discharge (ESD) resistance with respect to the semiconductor light-emitting elements of Examples 1-11 and comparative examples 1 and 2 are shown in Table 1.

was comparatively low, light-emitting output (Po) was 20 mW or higher, and power consumption was low with high luminance.

On the other hand, with respect to comparative example 1 in which the respective layers from the buffer layer 21 to the p-contact layer 14b were continuously laminated using one MOCVD apparatus, and with respect to comparative example 2 in which a regrowth layer was not provided, light-emitting output (Po) was low compared to Examples 1-11.

With respect to Examples 1-7 and Examples 9-11 where heat treatment was conducted prior to formation of the regrowth layer, reverse current (IR) was even lower than in Example 8 where heat treatment was not conducted prior to formation of the regrowth layer.

Examples of the First and Second Aspects

Example 12

The semiconductor light-emitting element 1 configured as shown in FIG. 1 was manufactured by the method shown below.

With respect to manufacture of the semiconductor light-emitting element 1 of Example 12, first, a buffer layer 21 composed of AlN, a ground layer 22 of 5 μm thickness composed of undoped GaN, an n-contact layer 12a of 3.2 μm thickness composed with a first step growth layer 12c of 3 μm thickness composed of Si-doped n-type GaN and a regrowth layer 12d of 0.2 μm thickness composed of Si-doped n-type GaN, an n-clad layer 12b of superlattice structure with a thickness of 80 nm constituted by repeatedly growing 20 thin-film layers composed of an n-side first layer of 2 nm thickness composed of GaInN and an n-side second layer of 2 nm thickness composed of GaN, a light-emitting layer 13 of multiple quantum well structure in which an Si-doped GaN barrier layer of 5 nm thickness and an $In_{0.15}Ga_{0.85}N$ well layer of 3.5 nm thickness are laminated 6 times with final provision of a barrier layer, a p-clad layer 14a of 10 nm thickness composed of an Mg-doped single layer of $Al_{0.07}Ga_{0.93}N$, and a p-contact layer 14b of 150 nm thickness

TABLE 1

| | Heat treatment | Regrowth layer thickness (μm) | Number of n-clad layer pairs | Forward voltage (V) | Light-emitting output (Po) (mV) | Reverse current (IR) @VR = 20 V (μA) | Electrostatic discharge (ESD) resistance (kV) |
|---|---|---|---|---|---|---|---|
| Example 1 | Yes | 0.2 | 20 | 3.1 | 21 | 0.7 | 4 |
| Example 2 | Yes | 0.2 | Single layer | 3.1 | 21 | 0.5 | 4 |
| Example 3 | Yes | 0.2 | 30 | 3.1 | 22 | 0.9 | 4 |
| Example 4 | Yes | 0.2 | 40 | 3.1 | 22 | 1.5 | 4 |
| Example 5 | Yes | 0.4 | 20 | 3.1 | 22 | 1.0 | 4 |
| Example 6 | Yes | 0.6 | 20 | 3.1 | 22 | 0.9 | 4 |
| Example 7 | Yes | 1 | 20 | 3.1 | 23 | 1.1 | 4 |
| Example 8 | No | 0.2 | 20 | 3.2 | 20 | 3.2 | 3 |
| Example 9 | Yes | 0.2 | 10 | 3.2 | 20 | 1.2 | 4 |
| Example 10 | Yes | 2 | 20 | 3.1 | 22 | 1.6 | 4 |
| Example 11 | Yes | 0.05 | 20 | 3.2 | 19 | 2.5 | 4 |
| Comparative example 1 | Consecutive growth | — | 20 | 3.3 | 15 | 7.2 | 1 |
| Comparative example 2 | Yes | 0 | 20 | 3.2 | 14 | 10.0 | 1 |

As shown in Table 1, with respect to any one of Examples 1-11, reverse current (IR) was sufficiently low, electrostatic discharge (ESD) resistance was excellent, forward voltage composed of Mg-doped p-type GaN are sequentially laminated onto a substrate 11 composed of sapphire that is circular in the planar view to obtain the laminate.

In the semiconductor light emitting element 1 of Example 12, the buffer layer 21, ground layer 22, and first step growth layer 12c were laminated using a first MOCVD apparatus (first step). The regrowth layer 12d, n-clad layer 12b, light-emitting layer 13, p-clad layer 14a, and p-contact layer 14b were laminated using a second MOCVD apparatus (second step). The light-emitting layer 13 was grown under the growth conditions shown below, while the other layers such as the first step growth layer and the regrowth layer were formed under the same conditions as Example 1.

[Film Formation Conditions of the Light-Emitting Layer 13]

The light-emitting layer was grown by setting the substrate temperature at 770° C. and the pressure in the deposition chamber at 600 mbar, and by supplying trimethyl gallium (TMGa) which is a Group III raw material to the deposition chamber together with nitrogen gas which is the first carrier gas of a flow rate of 39 SLM, while simultaneously supplying ammonia ($NH_3$) which is a nitrogenous raw material to the aforementioned deposition chamber together with nitrogen gas which is the second carrier gas of a flow rate of 20 SLM. With respect to growth pressure and carrier gas flow rate, the same conditions were applied to the well layer and the barrier layer.

Subsequently, on the p-contact layer 14b, a translucent electrode 15 of 200 nm thickness composed of ITO was formed by a commonly known photolithography technique.

Next, etching was conducted using a photolithography technique, the first step growth layer 12c of the n-contact layer 12a was exposed in a desired region, and an n-type electrode 17 of Ti/Au double-layer structure was formed on an exposed surface 20a of the n-contact layer 12a.

Moreover, a p-type bonding pad structure 16 of triple-layer structure constituted by a metal reflective layer of 200 nm composed of Al, a barrier layer of 80 nm composed of Ti, and a bonding layer of 1100 nm composed of Au was formed on the translucent electrode 15 using a photolithography technique.

Subsequently, the substrate 11 was divided (chipped) to obtain the semiconductor light-emitting element 1 of Example 12 having the structure shown in FIG. 1.

With respect to the semiconductor light-emitting element 1 of Example 12 obtained in this manner, the carrier concentration of the first step growth layer 12c and the regrowth layer 12d was $8\times10^{18}/cm^{-3}$, the carrier concentration of the n-clad layer 12b was $5\times10^{18}/cm^{-3}$, the carrier concentration of the p-contact layer 14b was $5\times10^{18}/cm^{-3}$, and the Mg doping amount of the p-clad layer 14a was $5\times10^{19}/cm^{-3}$.

Example 13

The semiconductor light-emitting element 1 was obtained in the same manner as Example 12, except that pressure in the deposition chamber was set at 800 mbar when growing the light-emitting layer 13.

Comparative Example 3

The semiconductor light-emitting element 1 was obtained in the same manner as Example 12, except that pressure in the deposition chamber was set at 200 mbar when growing the light-emitting layer 13.

Comparative Example 4

The semiconductor light-emitting element 1 was obtained in the same manner as Example 12, except that pressure in the deposition chamber was set at 400 mbar when growing the light-emitting layer 13.

The semiconductor light-emitting elements of Examples 12 and 13 and Comparative examples 3 and 4 obtained in this manner were mounted on a TO-18 can package, and light-emitting output (Po) was measured by tester within an applied current range of 0-100 mA. The results are shown in Table 2 and Table 3.

TABLE 2

|  | Growth pressure of light-emitting layer [mbar] | Reverse current (IR) uA | Forward voltage [V] | Peak wavelength [nm] |
| --- | --- | --- | --- | --- |
| Comparative example 3 | 200 | 0.23 | 3.04 | 452 |
| Comparative example 4 | 400 | 1.18 | 3.06 | 450 |
| Example 12 | 600 | 0.06 | 3.05 | 450 |
| Example 13 | 800 | 0.14 | 3.02 | 450 |

TABLE 3

| Applied current [mA] | Comparative example 3 | Comparative example 4 | Example 12 | Example 13 |
| --- | --- | --- | --- | --- |
| 20 | 19 mW | 20 mW | 21 mW | 22 mW |
| 50 | 43 mW | 45 mW | 46 mW | 46 mW |
| 70 | 56 mW | 59 mW | 61 mW | 61 mW |
| 80 | 63 mW | 66 mW | 67 mW | 68 mW |
| 100 | 75 mW | 79 mW | 81 mW | 82 mW |

With respect to the semiconductor light-emitting elements of Examples 12 and 13 and Comparative examples 3 and 4, forward voltage at a current application value of 20 mA was measured by energization with a probe needle.

Moreover, with respect to the semiconductor light-emitting elements of Examples 12 and 13 and Comparative examples 3 and 4, current flowing to the LED element at the time of application of reverse voltage of 20 V to the element (reverse current IR) was measured.

The results for forward voltage and reverse current (IR) with respect to Examples 12 and 13 and Comparative examples 3 and 4 are shown in Table 2.

Power efficiency (%) was computed using forward voltage, applied current, and light-emitting output [light-emitting output (mW)/(forward voltage (V)×applied current (mA))]. The results are shown in Table 4. Table 4 shows the relation between applied current and power efficiency for the semiconductor light-emitting elements of Examples 12 and 13 and Comparative examples 3 and 4.

In addition, the peak wavelength of the emitted light of the semiconductor light-emitting elements of Examples 12 and 13 and Comparative examples 3 and 4 was studied. The results are shown in Table 2.

TABLE 4

| Applied current [mA] | Comparative example 3 | Comparative example 4 | Example 12 | Example 13 |
| --- | --- | --- | --- | --- |
| 20 | 31.4% | 31.8% | 33.0% | 34.2% |
| 50 | 24.7% | 25.0% | 26.0% | 27.1% |
| 70 | 21.8% | 22.3% | 23.1% | 24.3% |
| 80 | 20.7% | 21.2% | 21.9% | 23.1% |
| 100 | 18.7% | 19.2% | 19.9% | 21.1% |

As shown in Table 2, with respect to Examples 12 and 13, reverse current (IR) was sufficiently low, light-emitting output (Po) was 21 mW or higher when applied current was 20 mA, and power consumption was low with high luminance.

On the other hand, with respect to Comparative examples 3 and 4 in which pressure within the deposition chamber was less than 500 mbar when growing the light-emitting layer 13, light-emitting output (Po) was lower than Examples 12 and 13 when applied current was 20 mA.

As shown in Table 3, with respect to Examples 12 and 13 and Comparative examples 3 and 4, light-emitting output (Po) increases as applied current increases. However, with Comparative examples 3 and 4, the light-emitting output enhancement effect obtained by increasing applied current decreases as applied current increases, and the differential in light-emitting output (Po) between Examples 12 and 13 and Comparative examples 3 and 4 increases as applied current increases.

Moreover, as shown in Table 4, with respect to Examples 12 and 13 and Comparative examples 3 and 4, in cases where applied current is larger than the applied current of 20 mA that is ordinarily used, power efficiency decreases as applied current increases. However, power efficiency is higher in Examples 12 and 13 than in Comparative examples 3 and 4, and the differential in power efficiency between Examples 12 and 13 and Comparative examples 3 and 4 increases as applied current increases.

From Table 3 and Table 4, it is possible to confirm that the semiconductor light-emitting elements of Examples 12 and 13 are able to effectively improve light-emitting output by applying large volumes of current, and that they obtain higher light-emitting output by applying large volumes of current than the semiconductor light-emitting elements of Comparative examples 3 and 4.

Example 14

The manufacturing process of the semiconductor light-emitting element 1 until the stage prior to division (chipping) of the substrate 11 was conducted in the same manner as Example 12, except that the first carrier gas was supplied at a flow rate of 50 SLM to the deposition chamber when growing the light-emitting layer 13.

With respect to the semiconductor light-emitting element of Example 14 at the stage prior to division (chipping) of the substrate 11 obtained in this manner and the semiconductor light-emitting element of Example 12 at the stage prior to division (chipping) of the substrate 11, a study was made of light-emitting intensity from one end to the other end along the diameter of the substrate 11 that is circular in the planar view, and irregularities in light-emitting intensity in the plane of the substrate 11 were investigated. The results are shown in FIG. 4 and FIG. 5.

Figure 4:
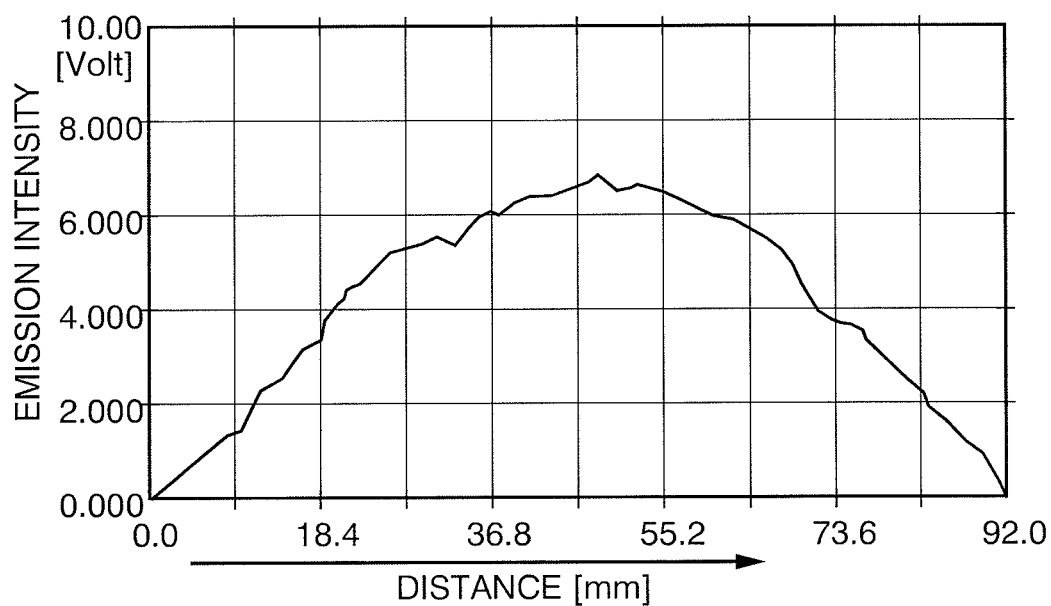
FIG. 4 is a graph which shows the relation between light-emitting intensity and distance from one end to the other end along the diameter of the substrate in the semiconductor light-emitting element of Example 12 at the step before division of the substrate.

FIG. 4 is a graph which shows the relation between light-emitting intensity (PL light-emitting intensity; unit is optional) and distance from one end to the other end along the diameter of the substrate with respect to the semiconductor light-emitting element of Example 12 at the stage prior to division (chipping) of the substrate 11. FIG. 5 is a graph which shows the relation between light-emitting intensity (PL light-emitting intensity; unit is optional) and distance from one end to the other end along the diameter of the substrate with respect to the semiconductor light-emitting element of Example 14 at the stage prior to division (chipping) of the substrate 11.

Figure 5:
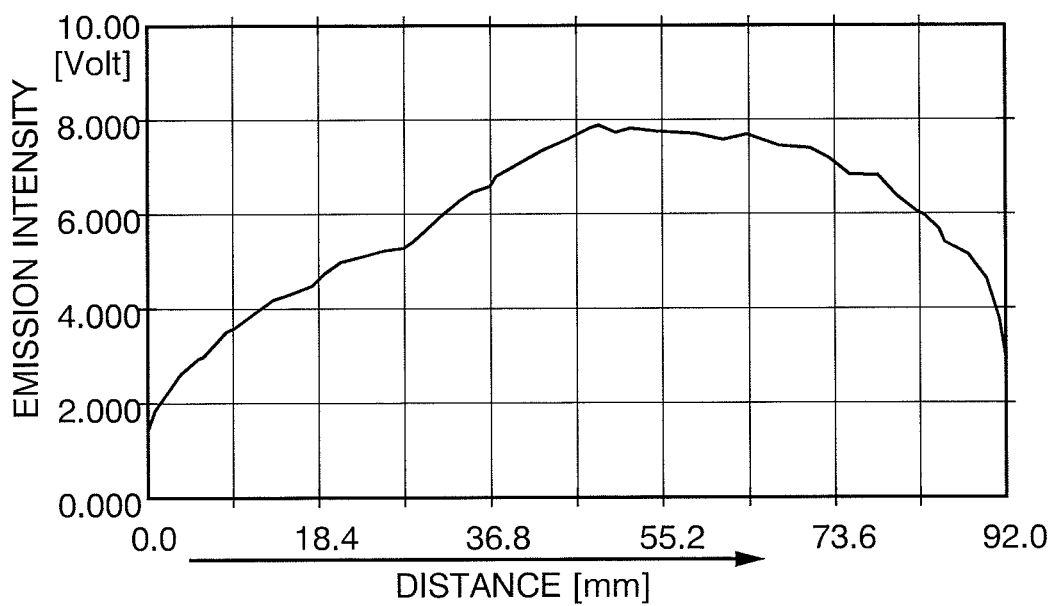
FIG. 5 is a graph which shows the relation between light-emitting intensity and distance from one end to the other end along the diameter of the substrate in the semiconductor light-emitting element of Example 14 at the step before division of the substrate.

As shown in FIG. 4 and FIG. 5, with respect to Example 14 shown in FIG. 5 where the first carrier gas is supplied to the deposition chamber at a flow rate of 50 SLM when growing the light-emitting layer 13, compared to Example 12 shown in FIG. 4 where the first carrier gas is supplied to the deposition chamber at a flow rate of 39 SLM when growing the light-emitting layer 13, it is found that light-emitting intensity is higher overall, that light-emitting intensity is particularly higher at the outer edge portion, and that irregularities in light-emitting intensity are smaller in the plane of the substrate 11 prior to division (chipping) of the substrate 11.

INDUSTRIAL APPLICABILITY

According to the present invention, a semiconductor light-emitting element manufacturing method is offered which is capable of manufacturing a semiconductor light-emitting element which inhibits defects in the p-type semiconductor layer deriving from the dopant used when forming the n-type semiconductor layer, and which also obtains high output. Moreover, a semiconductor light-emitting element manufacturing method is offered which is capable of manufacturing a semiconductor light-emitting element which obtains high light-emitting output by application of a large volume of current.

DESCRIPTION OF THE REFERENCE NUMERALS

1: semiconductor light-emitting element (semiconductor light-emitting element)
3: lamp
12: n-type semiconductor layer
12a: n-contact layer (n-type semiconductor layer)
12b: n-clad layer (second n-type semiconductor layer)
12c: first step growth layer (first n-type semiconductor layer)
12d: regrowth layer
13: light-emitting layer (active layer)
14: p-type semiconductor layer

The invention claimed is:

1. A semiconductor light-emitting element manufacturing method comprising:
a first step in which a first n-type semiconductor layer is laminated onto a substrate in a first organometallic chemical vapor deposition apparatus;
and a second step in which a regrowth layer, a second n-type semiconductor layer, an active layer, and a p-type semiconductor layer are sequentially laminated onto said first n-type semiconductor layer in a second organometallic chemical vapor deposition apparatus, wherein the regrowth layer is a regrowth layer of the first n-type semiconductor layer laminated in the first step, said first n-type semiconductor layer and regrowth layer are n-contact layers, and said second n-type semiconductor layer is an n-clad layer.

2. The semiconductor light-emitting element manufacturing method according to claim 1, wherein, in said second step, said second n-type semiconductor layer has a superlattice structure obtained by repetitive growth of 20-40 thin-film layers.

3. The semiconductor light-emitting element manufacturing method according to claim 1, wherein the growth conditions of said first n-type semiconductor layer in said first step and the growth conditions of said regrowth layer in said second step are identical.

4. The semiconductor light-emitting element manufacturing method according to claim 1, wherein a thickness of said regrowth layer is 0.05 μm-2 μm.

5. The semiconductor light-emitting element manufacturing method according to claim 1, which has a sub-step wherein heat treatment is conducted at a heat treatment temperature of 500° C.-1000° C. in a nitrogen-containing atmosphere, prior to formation of said regrowth layer.

6. A semiconductor light-emitting element manufacturing method comprising:
- a first step in which a first n-type semiconductor layer is laminated on a substrate in a first organometallic chemical vapor deposition apparatus;
- and a second step in which a regrowth layer, a second n-type semiconductor layer, a light-emitting layer, and a p-type semiconductor layer are sequentially laminated on said first n-type semiconductor layer in a second organometallic chemical vapor deposition apparatus;
- wherein said light-emitting layer is grown at a pressure of 500 mbar-1013 mbar in a deposition chamber of said second organometallic chemical vapor deposition apparatus in said second step.

7. The semiconductor light-emitting element manufacturing method according to claim 6, which comprises
- a step in which said light-emitting layer is grown as a layer composed of a Group III nitride semiconductor layer by supplying a Group III raw material containing a Group III element to said second organometallic chemical vapor deposition chamber together with a first carrier gas of a flow rate of 30 SLM-100 SLM, and by simultaneously supplying a nitrogen raw material that contains nitrogen or a nitrogen compound together with a second carrier gas to said deposition chamber.

* * * * *